United States Patent [19]
Park et al.

[11] Patent Number: 4,544,875
[45] Date of Patent: Oct. 1, 1985

[54] VARIABLE CURRENT TRANSDUCER SYSTEM

[75] Inventors: Kyong Park; Tom O. Kavli, both of Chatsworth, Calif.

[73] Assignee: Kavlico Corporation, Chatsworth, Calif.

[21] Appl. No.: 615,291

[22] Filed: May 29, 1984

[51] Int. Cl.$^4$ .......................... G05F 1/46; G01L 9/12
[52] U.S. Cl. ..................... 323/280; 73/724; 73/708
[58] Field of Search ................. 363/73; 323/273, 280, 323/281, 311, 312; 307/151, 494; 324/76 A; 330/252, 254, 299; 73/708, 734

[56] References Cited

U.S. PATENT DOCUMENTS

| | | | |
|---|---|---|---|
| 3,768,012 | 10/1973 | Wilkinson | 323/273 |
| 4,227,419 | 10/1980 | Park | 73/724 |
| 4,251,743 | 2/1981 | Hareyana | 323/273 |

FOREIGN PATENT DOCUMENTS

| | | | |
|---|---|---|---|
| 57-20820 | 2/1982 | Japan | 323/312 |
| 699500 | 11/1979 | U.S.S.R. | 307/494 |

Primary Examiner—Peter S. Wong
Assistant Examiner—Judson H. Jones
Attorney, Agent, or Firm—Poms, Smith, Lande & Rose

[57] ABSTRACT

A pressure or other transducer having a normal variable voltage output is converted to a unit having a variable current output in response to the normal output voltage with the minimum current drawn by the unit being only slightly greater than that required to operate the basic voltage-type transducer. The new current output system includes a voltage regulator and a voltage-to-current converter. The voltage-to-current converter includes an operational amplifier and an output transistor, with one input to the operational amplifier being set at a voltage equal to the output voltage of the voltage-type pressure transducer at zero pressure. The output from the voltage-type pressure transducer is connected through a first gain adjusting potentiometer to the second input of the operational amplifier; and an additional offset adjustment potentiometer is connected between the output of the voltage regulator and the junction between the gain adjustment potentiometer and the second input to the operational amplifier. The voltage regulator and the voltage-to-current converter may both include output buffering transistors. Where the voltage-type pressure transducer draws about 3.5 milliamperes, the minimum current from the entire system is only about 4 milliamperes, and may even be set below 4 milliamperes.

18 Claims, 3 Drawing Figures

VARIABLE CURRENT TRANSDUCER SYSTEM

FIELD OF THE INVENTION

This invention relates to transducer systems, such as pressure transducer systems, providing a variable current output with variable input voltages from the transducer.

BACKGROUND OF THE INVENTION

For many industrial control applications, it is necessary to send the output signal from a transducer over a long wire, and similarly, the power to operate the transducer must be transmitted over a substantial distance. When transducers, such as pressure transducers, have a voltage output, it is a common experience to see a significant amount of loss or reduction in the voltage at the other end of the long wire, due to the wire resistance. Accordingly, for many applications, it is preferred to transmit current signals rather than voltage signals, in responses to changes in pressure or other input to a transducer.

Concerning another factor which comes into play, it is desirable that the minimum current transmitted over the long wire, for example at the lowest pressure to be measured, be relatively low. In this regard, a current range of from 4 milliamperes to 20 milliamperes has become an industrial standard. Where a certain amount of current is required to power the basic voltage-type pressure transducer, it is therefore desirable to minimize the additional current required to convert from voltage output to a current output.

Accordingly, a principal object of the present invention is to provide a simple and inexpensive system for converting a voltage type transducer into a system wherein the output current is proportional to the normal voltage output variations; and wherein the power drain required for the additional conversion circuitry is minimal. Collateral objects of the present invention are to provide convenient and simple gain and offset adjustments for the output current, for compatibility with the cusomers' requirements.

SUMMARY OF THE INVENTION

In accordance with a specific illustrative example of the present invention, a system for converting a voltage-type transducer, such as a capacitive pressure transducer, into a current output unit, includes a voltage regulator for supplying operating power to the transducer, and a voltage-to-current converter including an operational amplifier and an output transistor. One of the inputs of the operational amplifier is maintained at a reference potential substantially equal to the zero level output voltage of the transducer, and the other input to the operational amplifier is connected through a gain adjusting potentiometer to the output of the voltage type transducer. An additional offset adjustment potentiometer is connected from the output of the voltage regulator to the junction between the gain adjusting potentiometer and the second input to the operational amplifier included in the voltage-to-current converter.

Other features of the invention may include the following:

1. The voltage regulator may include an internal precision voltage reference, so that, despite variations in the input voltage, for example, from 10 to 40 volts, the output voltage to the voltage-type pressure transducer may be held close to the desired 5 volt level.

2. The voltage regulator and the voltage-to-current converter may both include operational amplifiers, and these may be part of a single chip, to reduce costs and current flow.

3. The system as described above may include a voltage-type pressure transducer which normally draws a predetermined level of current in the order of 3.5 milliamperes, and the system includes circuit means for establishing a minimum total output current of said system at a level below 5 milliamperes and preferably in the order of 4 milliamperes, or less than twenty percent above said predetermined level of current.

4. With the gain and the offset adjusting potentiometer being located as described hereinabove, the gain or slope of the output current vs. voltage input characteristic may be adjusted substantially independently of the offset, and similarly, the current offset may be changed substantially independently of the gain adjustment.

Concerning another aspect of the invention, the assignee of the present invention has a substantial demand for capacitance pressure transducers having a variable voltage output, of the general type disclosed, for example, in U.S. Pat. No. 4,227,419, granted Oct. 14, 1980. Through the use of the relatively low cost circuitry disclosed in this specification, with its very low current drain, the demand for either voltage output type pressure transducers or current output type pressure transducers can readily be met, without the need for the development of an entirely new current output-type capacitive pressure transducer system.

Other objects, features, and advantages of the invention will become apparent from a consideration of the following detailed description and from the accompanying drawings.

DETAILED DESCRIPTION

Figure 1:
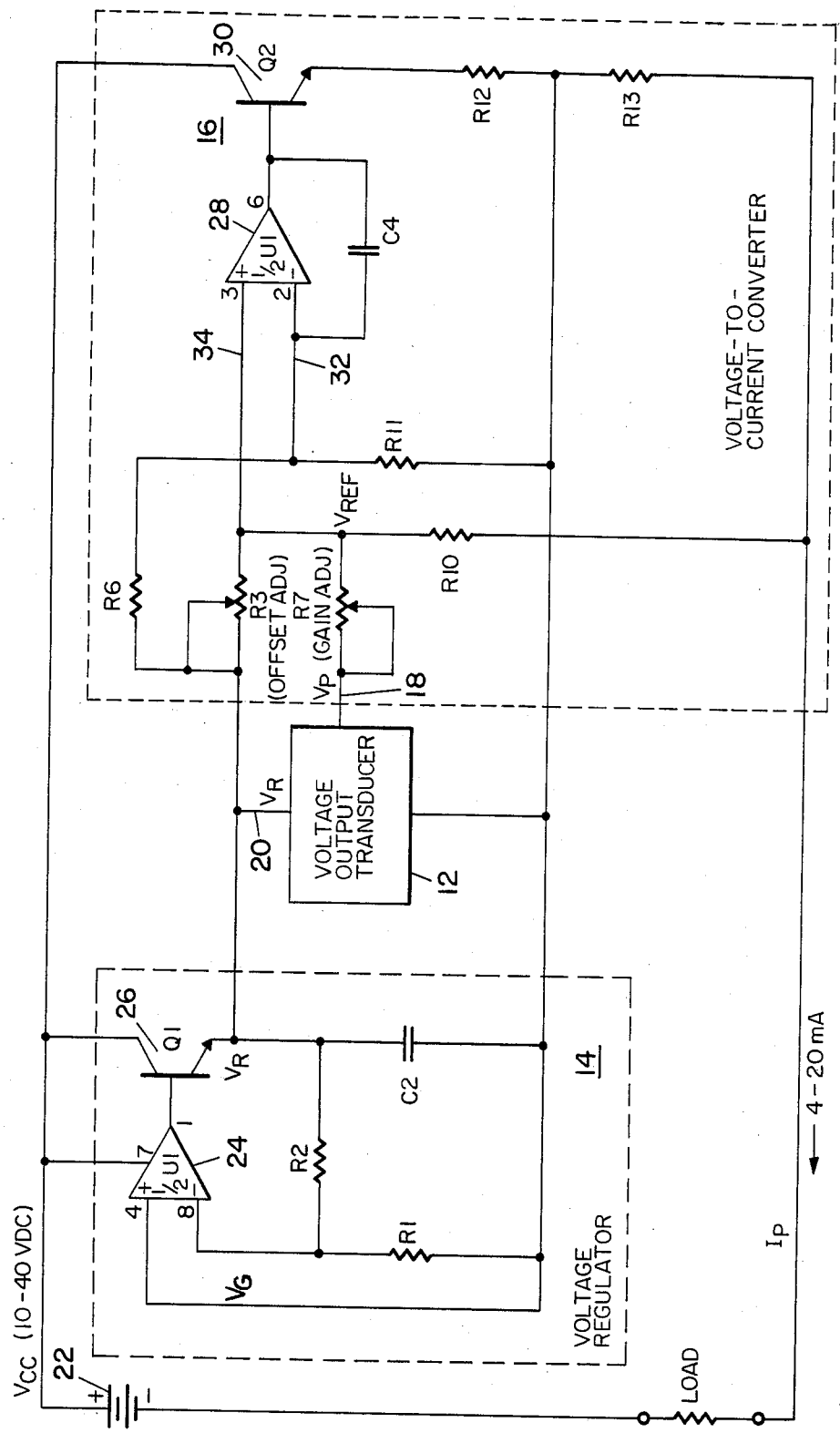
FIG. 1 is a circuit diagram of a system illustrating the principles of the present invention.

Referring more particularly to the drawings, the three main components of the circuit of FIG. 1 includes the voltage type output capacitive pressure transducer 12, the voltage regulator 14, and the voltage-to-current converter 16. As mentioned hereinabove, the pressure transducer 12 may be of the general type described in U.S. Pat. No. 4,227,419, granted Oct. 14, 1980, and assigned to the assignee of this patent application. The pressure transducer 12 includes a ceramic capacitance unit with a diaphragm which flexes with changes in pressure, and capacitive plates on the diaphragm and on an adjacent substrate, which vary in their spacing from one another. This change in spacing produces capacitance changes which are converted into output voltage changes, for example, at lead 18, in FIG. 1.

By way of example, but not of limitation, the pressure transducer 12 is designed to operate with 5 volt potential supplied to it, for example, on lead 20, and over the intended pressure operating range of the transducer 12, it provides a linear output voltage ranging from 0.5 volts at zero pressure up to 4.5 volts at the maximum rated pressure. Now, it is assumed that the voltage supply indicated by reference numeral 22 may vary significantly, for example, from 20 to 40 volts DC. In order to provide the desired constant 5 volts on lead 20 to the pressure transducer 12, the voltage regulator 14 is provided. It includes the operational amplifier 24 and the transistor 26. Incidentally, the operational amplifier 24 included in the voltage regulator 14 and the operational amplifier 28 included in the converter 16 are both part of a single integrated circuit such as the LM10H. This circuit has an internal precision voltage reference which we will designate by $V_i$. This voltage reference is situated at the positive input to the operational amplifier 24, giving a positive offset voltage to the input voltage $V_G$. The regulated voltage $V_R$ on lead 20 will then be given by the following expression, where the resistors R1 and R2 are located as shown within the voltage regulator 14:

$$V_R = V_i \cdot \frac{R1 + R2}{R1} \quad (1)$$

The capacitor C2 is provided for smoothing purposes.

The voltage-to-current converter 16 includes the operational amplifier 28 and the transistor 30. The resistors R6 and R11 are provided to bias the negative input terminal 32 of the operational amplifier 28 to 0.5 volts, which is the minimum output voltage from the pressure transducer 12, when zero pressure is applied to its input. The positive input 34 of the operational amplifier 28 is connected to the output 18 from pressure transducer 12 by the gain adjusting potentiometer R7. The offset adjustment potentiometer R3 is connected from the output of the voltage regulator 14 to the junction between the gain adjusting potentiometer R7 and the positive input 34 of the operational amplifier 28. The voltage drop through R13, which is proportional to the transmitter output current, is fed back to the positive input 34 to the operational amplifier 28, through resistor R10 to provide a negative feedback loop.

The output current $I_P$ may be expressed as a function of the regulator voltage $V_R$ and the transducer output signal $V_p$ by the following formula:

$$I_p = \left(1 + \frac{R10}{R13}\right) \frac{1}{R7} V_p + \left(1 + \frac{R10}{R13}\right)\left(1 - \frac{R11}{R6 + R11}\right) \frac{1}{R3} \cdot V_R - \frac{R11}{R6 + R11}\left(\frac{1}{R13} + \frac{1}{R7} + \frac{R10}{R7 \cdot R13}\right) \cdot V_R \quad (2)$$

It may be observed from the foregoing expression that noninteracting adjustments of gain and offset may be obtained by selecting R7 for gain adjustment and R3 for offset adjustment.

Figure 2:
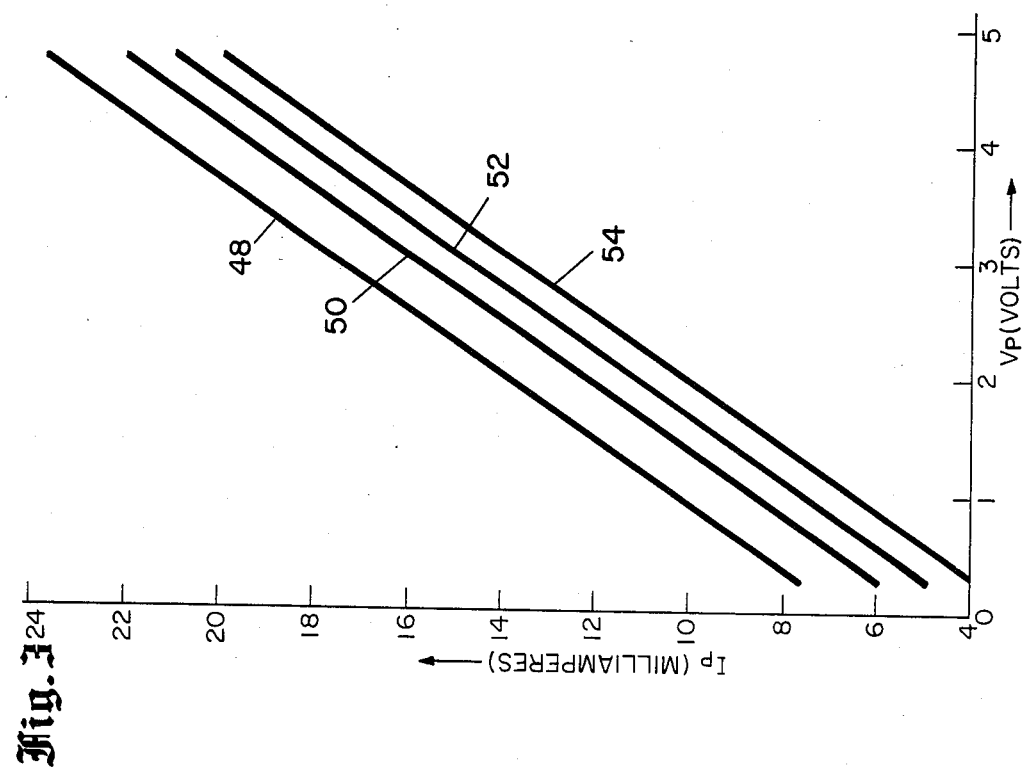
FIG. 2 is a plot of system output current plotted against the output voltage from the voltage-type pressure transducer, indicating changes in gain which may be accomplished by adjusting a single potentiometer.
Figure 3:
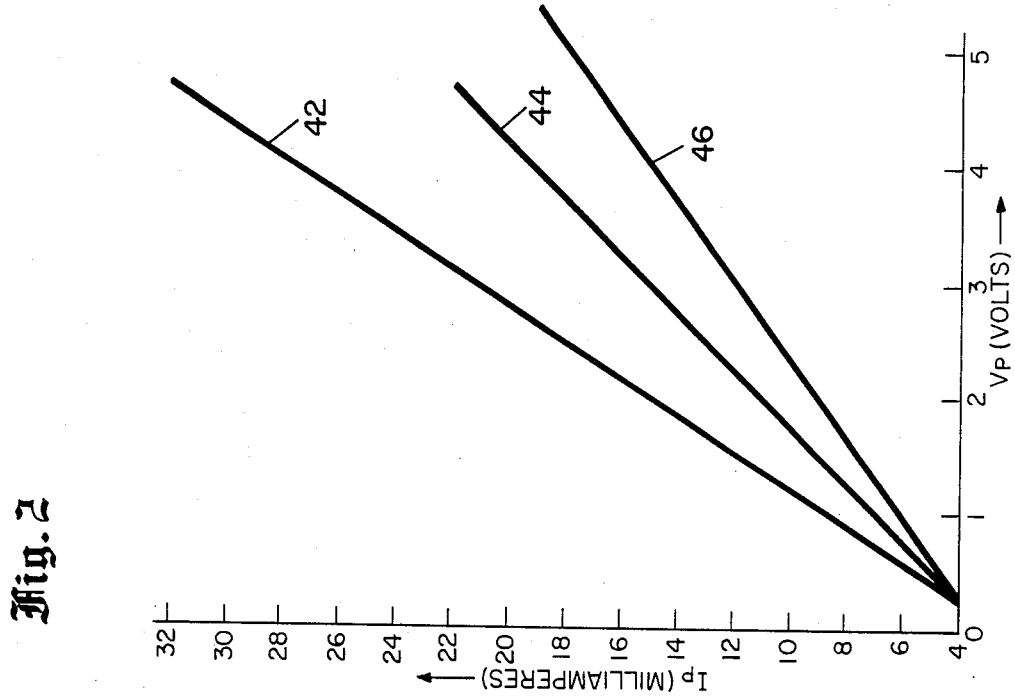
FIG. 3 is a similar plot of current versus voltage showing the changes in offset which may be accomplished by the adjusting of a single potentiometer.

FIGS. 2 and 3 show these non-interacting adjustments in terms of plots of output current in milliamperes versus the voltage output VP from the pressure transducer 12. In FIG. 2 the value of R3 has been held constant in connection with all three plots at 986.7 thousand ohms. However, in plot 42 the value of R7 is 308.7 thousand ohms; for plot 44, R7 is 500.7 thousand ohms; and for plot 46 the value of R7 is 736.7 thousand ohms. It may be observed from the plots of FIG. 2 that the gain or the slope adjustment of the characteristic may be varied, without significantly changing the offset point of the characteristics.

Similarly, in the case of FIG. 3, the potentiometer R7 has been held constant at 500.7 thousand ohms, and the potentiometer R3 has been varied from 698 thousand ohms for characteristic 48, to 803 thousand ohms for characteristic 50, to 876 thousand ohms for plot 52, and finally to 986 thousand ohms for plot 54. Again, we see that the offset has been changed by the adjustment of potentiometer R3, without changing the slope of the characteristics. Incidentally, for completeness it may be noted that the transistor 26 and 30 may be type 2M1613. In addition, the following values of components have proved satisfactory: R1—2,000 ohms; R2—45,300 ohms; C2—4.7 microfarads; R6—130,000 ohms; R11—14,300 ohms; R12—200 ohms; R13—80 ohms; and C4—100 picofarads.

In conclusion, it is understood that the foregoing detailed description and the accompanying drawings merely relate to one illustrative embodiment of the invention. The principles of the invention could also be implemented by a circuitry using a slightly different types of voltage regulator or voltage-to-current converter circuitry, as long as the principles outlined hereinabove, are included. Accordingly, the present invention is not limited to that precisely as shown in the drawings and as described in detail hereinabove.

What is claimed is:

1. A system for converting a capacitive pressure transducer having a variable output voltage to a current output unit comprising:
    a pressure transducer having a variable voltage output in response to variable input pressure applied to the transducer;
    voltage regulator means for supplying operating power to said pressure transducer;
    a voltage-to-current converter including an operational amplifier and an output transistor;
    means for applying a reference potential to one input of said operational amplifier substantially equal to the zero pressure output voltage of said pressure transducer;
    means for coupling the output of said transducer to the other input of said operational amplifier;
    said coupling means including first potentiometer means connected between the output of said pressure transducer and the second input of said operational amplifier to control the gain of the system; and
    second potentiometer means connecting the output from said voltage regulator to the junction of said first potentiometer means and said second input to said operational amplifier, to control the offset adjustment of said system.

2. A system as defined in claim 1 wherein said voltage regulator includes an internal precision voltage reference.

3. A system as defined in claim 1 wherein said pressure transducer requires at least 3.5 milliamperes of current, and wherein said system includes circuit means for establishing the minimum output current of said system at a level of approximately 4 milliamperes.

4. A system as defined in claim 1 wherein said pressure transducer requires at least 3.5 milliamperes of current, and wherein said system includes circuit means for establishing the minimum output current of said system at a level below 5 milliamperes.

5. A system as defined in claim 1 wherein said voltage regulator includes an operational amplifier, and wherein both of said operational amplifiers are included in a single semiconductor chip.

6. A system as defined in claim 1 including negative feedback circuit means coupled from the output of said transistor to said other input of said operational amplifier.

7. A system as defined in claim 1 including an output circuit from said system, resistive means interconnecting said output transistor to said output circuit, and negative feedback means including a resistor connected from said output circuit to said other input of said operational amplifier.

8. A system for converting a transducer having a variable output voltage to a current output transducer unit comprising:
- a transducer having a variable voltage output in response to variable input conditions sensed by the transducer;
- voltage regulator means for supplying operating power to said transducer;
- a voltage-to-current converter including an operational amplifier and an output transistor;
- means for applying a reference potential to one input of said operational amplifier;
- means for coupling the output of said transducer to the other input of said operational amplifier;
- said coupling means including first potentiometer means connected between the output of said transducer and the second input of said operational amplifier to control the gain of the system substantially independently of the offset of the current vs. voltage characteristic; and
- second potentiometer means connecting the output from said voltage regulator to the junction of said first potentiometer means and said second input to said operational amplifier, to control the offset adjustment of said system, substantially independently of the gain of the current vs. voltage characteristic.

9. A system as defined in claim 8 wherein said voltage regulator includes an internal precision voltage reference.

10. A system as defined in claim 8 wherein said transducer requires a predetermined level of current, and wherein said system includes circuit means for establishing the minimum output current of said system at a level of not more than twenty percent above said predetermined level.

11. A system as defined in claim 8 wherein said voltage regulator includes an operational amplifier, and wherein both of said operational amplifiers are included in a single semiconductor chip.

12. A system as defined in claim 8 including negative feedback circuit means coupled from the output of said transistor to said other input of said operational amplifier.

13. A system as defined in claim 8 including an output circuit from said system, resistive means interconnecting said output transistor to said output circuit, and negative feedback means including a resistor connected from said output circuit to said other input of said operational amplifier.

14. A system for converting a transducer having variable output voltage to a current output transducer unit comprising:
- a transducer having a variable voltage output in response to variable input conditions sensed by the transducer;
- voltage regulator means for supplying operating power to said transducer;
- a voltage-to-current converter including an operational amplifier and an output transistor;
- means for applying a reference potential to one input of said operational amplifier;
- means for coupling the output of said transducer to the other input of said operational amplifier;
- said coupling means including first potentiometer means connected between the output of said transducer and the second input of said operational amplifier to control the gain of the system substantially independently of the offset of the current vs. voltage characteristic;
- second potentiometer means connecting the output from said voltage regulator to the junction of said first potentiometer means and said second input to said operational amplifier, to control the offset adjustment of said system, substantially independently of the gain of the current vs. voltage characteristic, and
- negative feedback circuit means coupled from the output of said transistor to said other input of said operational amplifier.

15. A system as defined in claim 14 wherein said voltage regulator includes an internal precision voltage reference.

16. A system as defined in claim 14 wherein said transducer requires a predetermined level of current, and wherein said system includes circuit means for establishing the minimum output current of said system at a level of not more than twenty percent above said predetermined level.

17. A system as defined in claim 14 wherein said voltage regulator includes an internal precision voltage reference.

18. A system as defined in claim 14 wherein said voltage regulator includes an operational amplifier, and wherein both of said operational amplifiers are included in a single semiconductor chip.

* * * * *